United States Patent
Cavin et al.

(10) Patent No.: US 6,538,586 B1
(45) Date of Patent: Mar. 25, 2003

(54) DATA ENCODING STRATEGY TO REDUCE SELECTED FREQUENCY COMPONENTS IN A SERIAL BIT STREAM

(75) Inventors: Robert D. Cavin, Santa Clara, CA (US); Alan E. Waltho, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/062,841

(22) Filed: Jan. 30, 2002

(51) Int. Cl.[7] .................................. H03M 7/00
(52) U.S. Cl. ..................... 341/106; 341/58; 341/59
(58) Field of Search .................. 341/106, 58, 59; 342/196; 702/77; 708/404

(56) References Cited

U.S. PATENT DOCUMENTS

| 4,387,364 A | * | 6/1983 | Shirota ..................... 341/106 |
| 4,567,464 A | * | 1/1986 | Siegel et al. .................. 341/59 |
| 5,585,793 A | * | 12/1996 | Antoshenkov et al. ....... 341/106 |
| 5,801,649 A | * | 9/1998 | Fredrickson ................. 341/58 |
| 5,835,030 A | * | 11/1998 | Tsutsui et al. ............... 341/106 |
| 5,999,109 A | * | 12/1999 | Norrell et al. ................ 341/58 |
| 6,254,536 B1 | * | 7/2001 | DeVito ................... 340/825.19 |
| 6,255,967 B1 | * | 7/2001 | Norrell et al. ................ 341/58 |
| 6,278,387 B1 | * | 8/2001 | Rayskiy ....................... 341/61 |

* cited by examiner

*Primary Examiner*—Michael Tokar
*Assistant Examiner*—Khai Nguyen
(74) *Attorney, Agent, or Firm*—David N. Tran

(57) ABSTRACT

Frequency spectrums are determined for all possible codes given a predetermined number of bits in a code. A subset of these codes is formed based on spectral properties of codes in a desired frequency band. This subset of code is then used to encode data prior to transmission over a high-speed data bus to reduce undesirable emissions on targeted frequency bands.

26 Claims, 7 Drawing Sheets

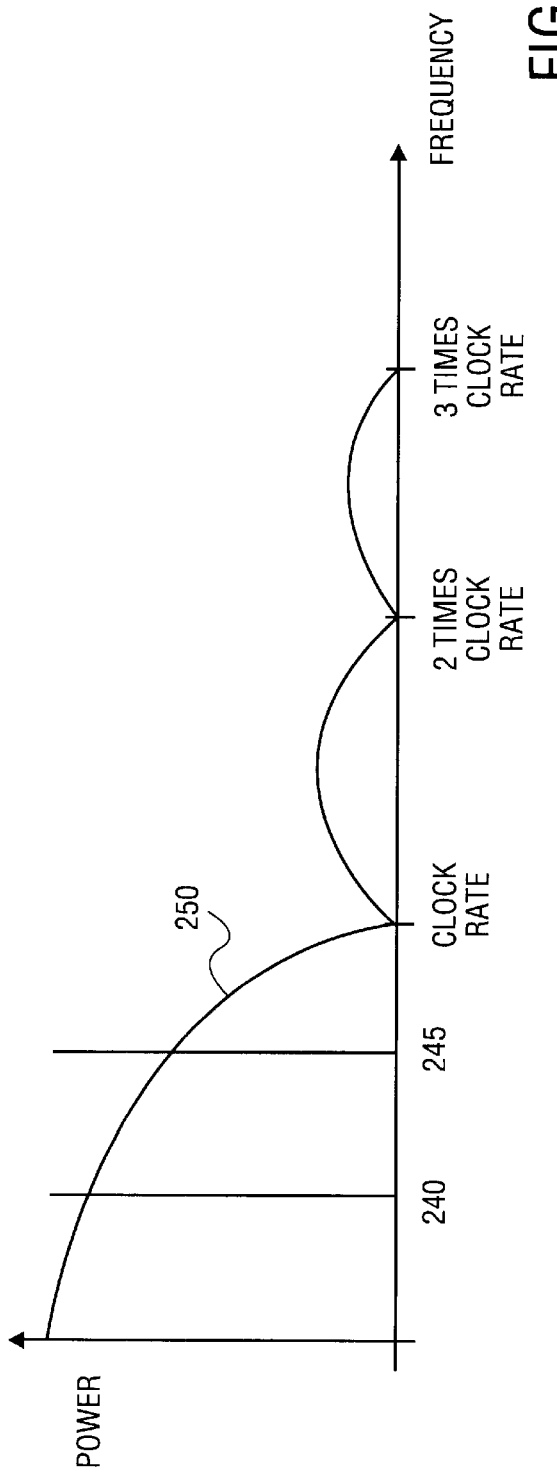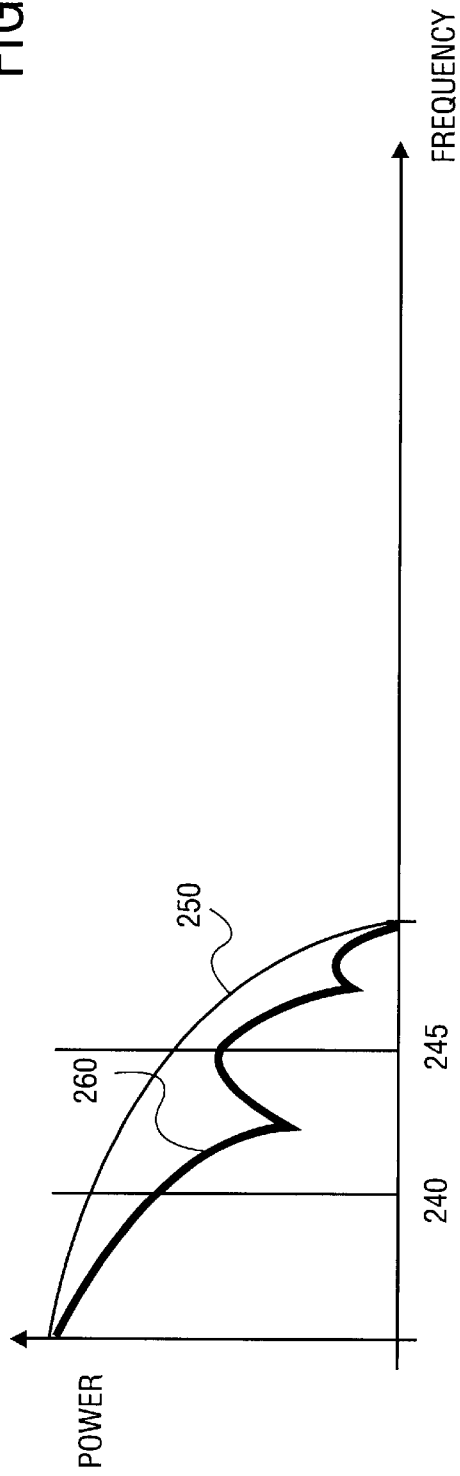

US 6,538,586 B1

DATA ENCODING STRATEGY TO REDUCE SELECTED FREQUENCY COMPONENTS IN A SERIAL BIT STREAM

FIELD OF THE INVENTION

The present invention relates generally to the field of data communication. More specifically, the present invention relates to methods and systems for reducing selected frequency components in binary data streams.

BACKGROUND

As clock rates of new system bus technologies such as third generation I/O (3GIO) rise due to increasing performance demands, more of the energy in the information passed on the data bus is located in frequency bands that have until now been occupied primarily by wireless technologies.

Although signal on a "wired" data bus is not purposefully transmitted in the typical radio frequency (RF) sense, some of this energy is broadcast as RF noise and may interfere with sensitive RF devices in close proximity. This problem may become an issue in mobile computer systems that are to incorporate both high-speed I/O systems and integrated wireless devices on the same platform.

FIG. 1 is a block diagram illustrating one example of a prior art mobile computer system. The system 10 includes a memory controller 105 that manages data flowing between a central processing unit (CPU) 100, memory 110, and wireless device 120 (e.g., RF device). The wireless device 120 includes an antenna 125. When the system 10 incorporates high-speed I/O systems and integrated wireless devices, undesired coupling, via several paths, is expected between signals on buses 101, 111, and 115 and the wireless device 120, causing interference that will reduce maximum throughput of the wireless device 120. For example, data transmission on the data buses 101, 111 and 115 may cause interference to the signal received by the antenna 125. Since the bus 115 is directly connected to the wireless device 120, it may also cause interference to the wireless device 120. Other interferences to the wireless device 120 may be caused by power plane coupling, waveguide coupling through the motherboard, etc.

BRIEF DESCRIPTION OF THE DRAWINGS

The present invention is illustrated by way of example, and not limitation, in the figures of the accompanying drawings in which like references indicate similar elements and in which:

FIG. 2A illustrates an example of a frequency spectrum of a string of random clocked binary data.

FIG. 2B illustrates an example of a frequency spectrum of a string of binary data encoded using the proposed example.

DETAILED DESCRIPTION

Figure 1:
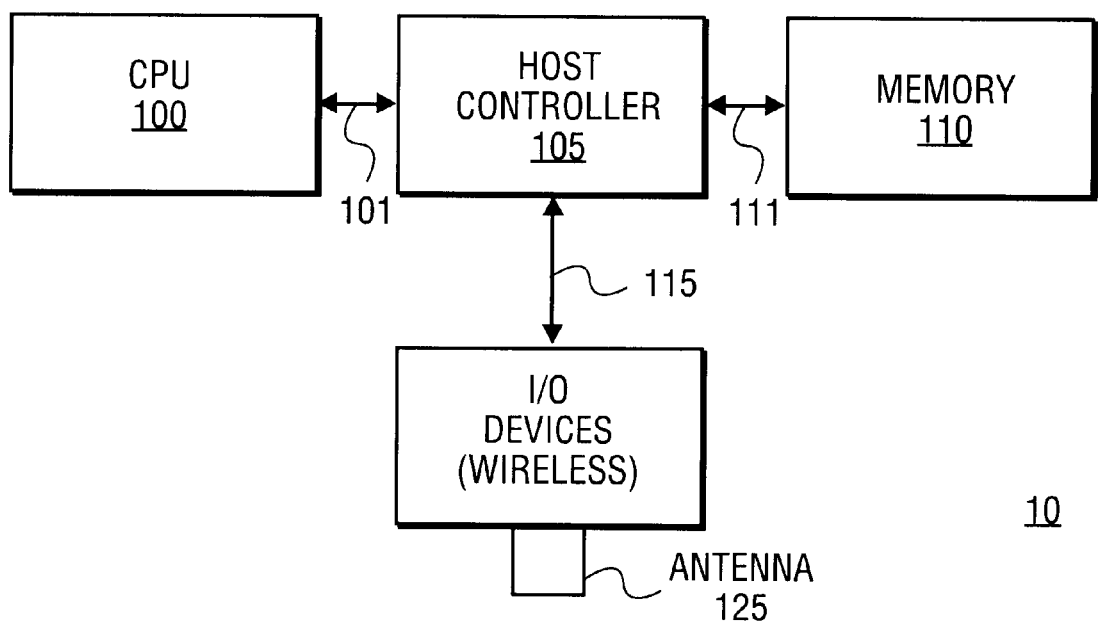
FIG. 1 is a block diagram illustrating one example of a prior art computer system with wireless input/output devices.

In one embodiment, a method for reducing targeted frequency components in a serial bit stream is disclosed. An encoding scheme is defined by first determining all possible codes of a predefined length that have desirable spectral properties for the target application. Codes are selected by evaluation of their frequency spectral strengths using the (FFT) Fast Fourier Transform. The encoding includes the codes that have lowest maximum FFT components in a desired frequency band.

In the following description, for purposes of explanation, numerous specific details are set forth to provide a thorough understanding of the present invention. It will be evident, however, to one skilled in the art that the present invention may be practiced without these specific details. In other instances, well known structures, processes, and devices are shown in block diagram form or are referred to in a summary manner in order to provide an explanation without undue detail.

Due to the complexity of isolating noise along different signal paths, it may be necessary to reduce targeted frequency components in the data stream itself. Reduction of spectral emissions is typically achieved by filtering the time-domain data waveform using band-rejection filters. However, these filters, whether digital signal processing (DSP) based or analog based, distort the transition edges of the original waveform resulting in a decreased eye and varying clock skew. This may not be acceptable in a high-speed serial I/O bus with an embedded clock. Another technique to reduce spectral emissions involves setting the data bus to a low speed mode. For example, in the low speed mode, the data bus runs at one-quarter-clock speed when a wireless device attempts to receive data. This low speed mode technique, however, reduces throughput significantly.

In one embodiment of the present invention, a data-encoding scheme is used. Recognizing that the required spectral notching can be achieved by encoding data going over an I/O bus, the data is encoded in such a way that the bit stream itself has spectral nulls at the desired frequencies. This encoding scheme, in conjunction with other physical and board-level isolation methods, may enable the use of both a high-speed data bus and wireless receivers to coexist in the same platform (i.e. wireless mobile client) with less impact to data throughput. The encoding scheme described herein is not limited to use with 3GIO. It may also be useful in other situations where the power contained in the signal on a serial data line (whether a stand-alone serial bus or part of a parallel bus) needs to be controlled in certain frequency bands.

In one embodiment, data is encoded by converting the next "m" bits that are to be transmitted over the data bus into an "n" bit code that includes the following criteria. First, the frequency spectrum of the "n" bit code has a notch in or near a frequency band of interest. Second, the "n" bit code is built of smaller "sub-codes" or is patterned in such a way that the boundary between "n" bit code sequences in the bit stream does not introduce significant noise in the desired rejection band. In some instances, a third criterion may be enforced when selecting the "n" bit code such that the "n" bit codes may need to have at least the same number of '1's as '0's to allow DC balancing of the codes using standard techniques.

FIG. 2A illustrates an example of a frequency spectrum of a string of random binary data. The frequency spectrum 250 corresponds to the average of a long unmodified string of input data transmitted over an I/O bus. In this example, the string is very long in order to have the average spectrum shown. Note that the energy or power level generated by transmitting this string of binary data in a frequency band between the frequency 240 and 245 is significant, and thus may cause unnecessary interference if there are wireless devices on the platform or nearby that receive data on frequencies in this band.

FIG. 2B illustrates an example of a frequency spectrum of an encoded string of data or code. The frequency spectrum 260 for the code includes several spectral nulls including one in the frequency band between the frequency 240 and the frequency 245. Note that the energy in this frequency band is lower than the energy shown in the frequency spectrum 250. Thus, if the frequency band between the frequency 240 and 245 is a desired frequency band, it would be preferable to use the encoded data instead of the unmodified input data to reduce possible interference.

Figure 3:
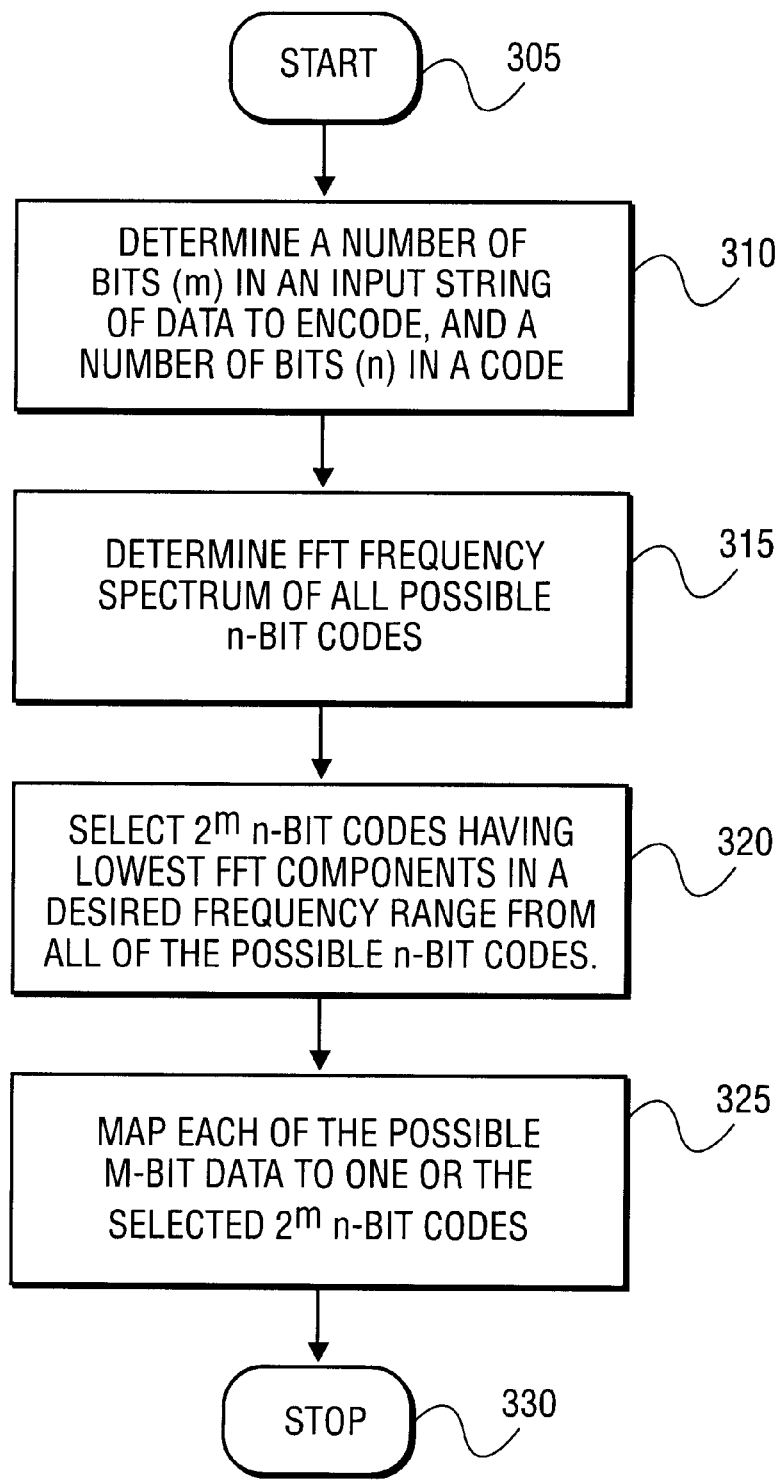
FIG. 3 illustrates one embodiment of an encoding process.

FIG. 3 illustrates one embodiment of an encoding process. The process starts at block 305. At block 310, size of an input string is determined. The input string represents a slice of the data being sent over the bus. For example, the size of the input string may be 8 bits. This size of the input string is represented as "m". The size "m" of the input string indicates the number of bits of input data to encode. In addition to the size of the input string, size of the code is also determined. The code is the encoded data corresponding to the input data. The size of the code is represented as "n". Generally, "n" is longer than "m". The larger the gap between "n" and "m", the higher is the overhead of encoding.

At block 315, a frequency spectrum is determined for each of all possible combinations of n bits ($2^n$ combinations). For example, the FFT of each of the possible strings of "n" bits (repeated multiple times to improve frequency resolution) may be used to determine the frequency spectrum. The repeated strings may be appended with a string of leading zeros and trailing zeros act as a windowing function.

At block 320, a subset of the $2^n$ possible combinations of "n" bits is formed. The subset includes $2^m$ of the $2^n$ possible combinations of "n" bits. The subset is formed by selecting the $2^m$ codes with the lowest energy or power level in a desired frequency band. For example, when "n"=11, there are $2^{11}$=2048 possible combinations of "n" bits strings. When "m"=8, there are only $2^8$=256 of the 2048 11-bits strings selected based on their energy in a frequency band from 1.5 GHz to 1.7 GHz. The frequency 1.5 GHz is the beginning and the frequency 1.7 GHz is the ending of the desired notch frequency band.

At block 325, each of the possible "m" bits string is mapped to one of the selected $2^m$ "n" bits codes. Thus, for example, when an 8-bit string is received at an encoder, a corresponding 11-bit code is transmitted across the data bus. Of course, when the 11-bits code is received, it is mapped to the corresponding 8-bit string. The process in FIG. 3 stops at block 330.

Figure 4:
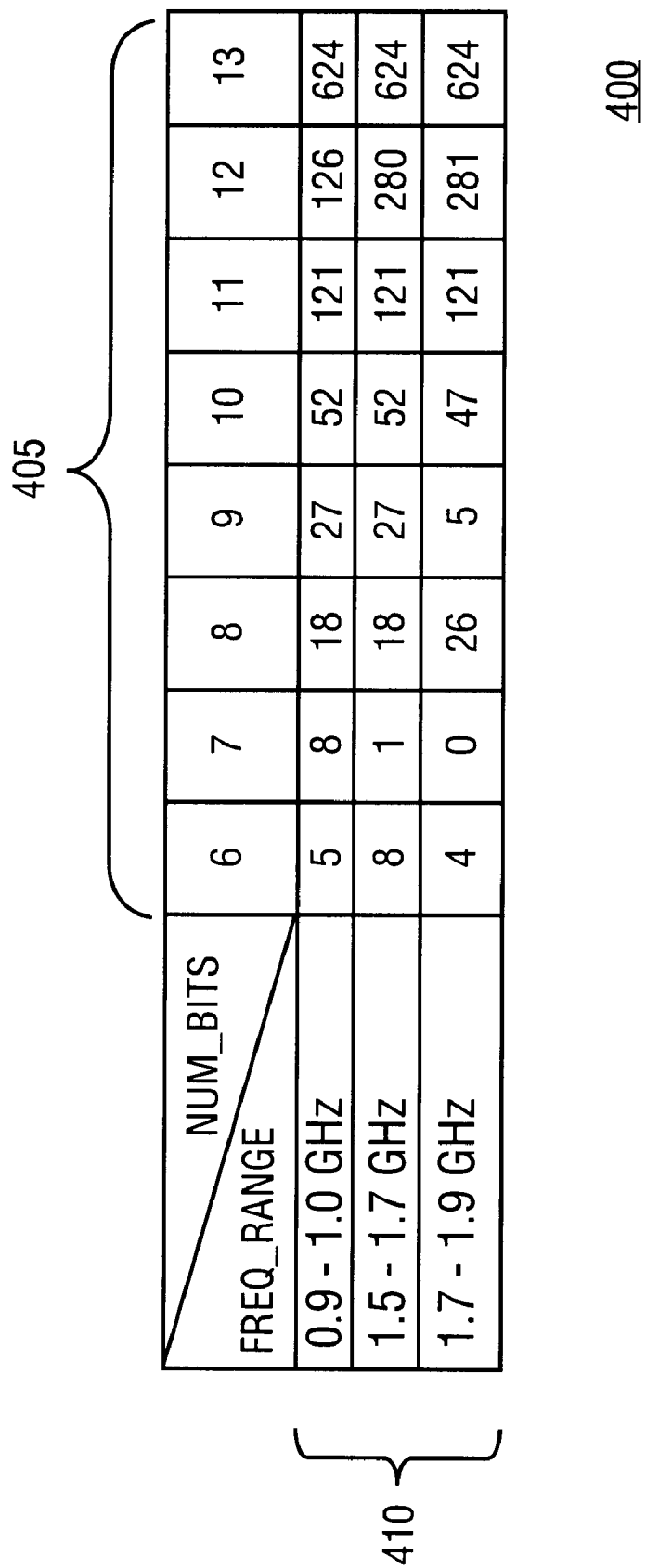
FIG. 4 is a table illustrating examples of the number of codes available based on the number of bits in the codes and the frequency ranges.

FIG. 4 is a table illustrating examples of the number of codes available based on the number of bits in the codes and the specified frequency bands. The first entry in each of the columns in group 405 represents the number of bits in the code (or code length). In this example, the number of bits ranges from 6 to 13. The first entry in each row in group 410 represents the frequency bands. In this example, there are three frequency bands, 0.9 to 1.0 GHz, 1.5 to 1.7 GHz, and 1.7 to 1.9 GHz.

Obtaining a useful set of codes may require selecting an appropriate code length to match the desired frequency range. Choosing incorrect lengths may yield few codes with the desired null, or codes that cannot be combined in a manner that retains the notching performance.

When a code length is selected, the notching characteristics of the code set can be verified. For example, input strings are converted into codes using a look-up table. Conversion from the input strings to the codes may also be performed using simple mapping algorithms. In cases where all of the codes contain equal number of '1's and '0's or when DC balancing is not required, there is a one-to-one mapping from the "m" bit strings to the "n" bit codes. That is, every input string corresponds to one code. When DC balancing is employed, each "m" bit input string is converted either to the "n" bit code or the inverse of the "n" bit code if the running track of the difference of '1's and '0's in the bit stream indicates an excess of '1's.

Figure 5:
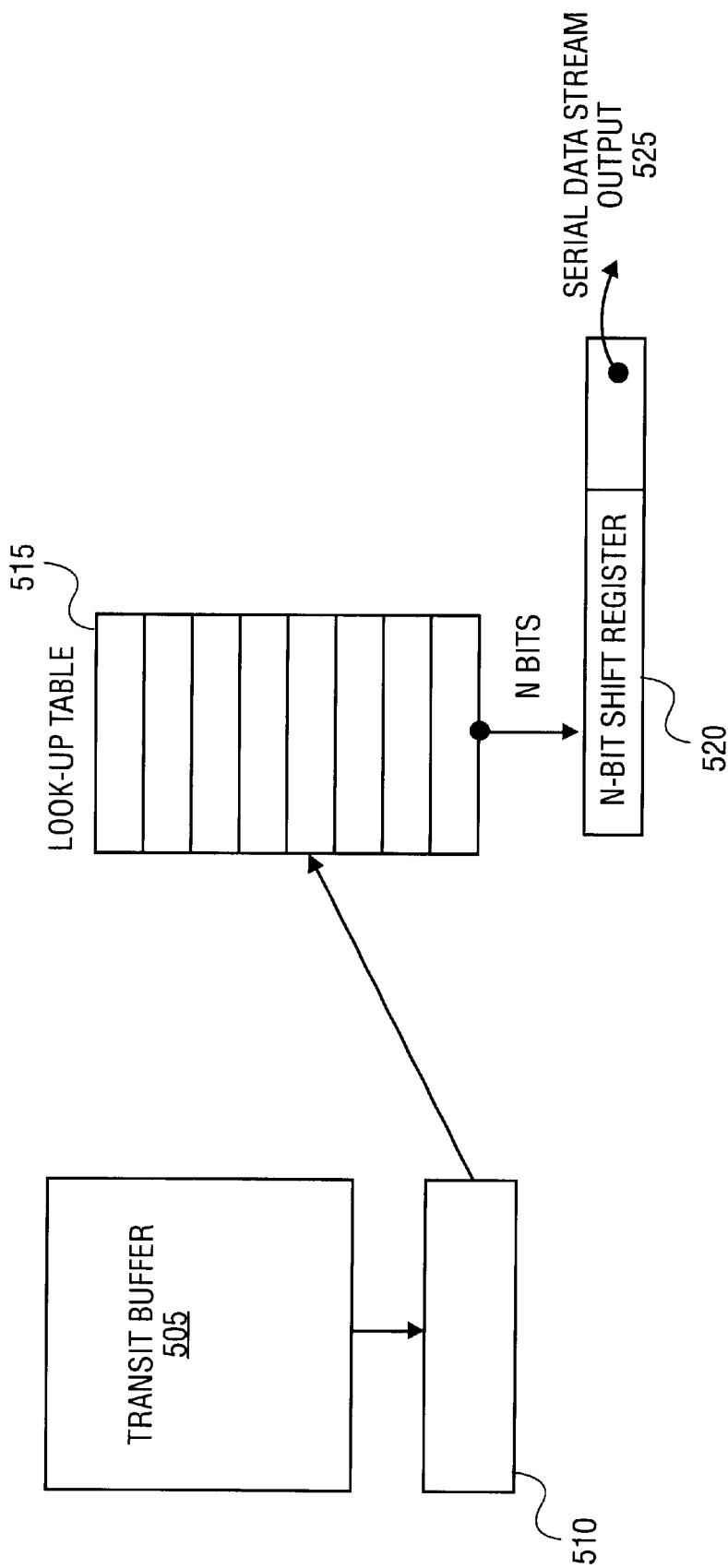
FIG. 5 is a block diagram illustrating one example of an encoding mechanism using a byte from a transmit buffer.

The codes may be stored in a memory and used as a look up table. In one embodiment, there may be more than one lookup table to store encoded data for different encoding schemes. For example, data transferred using different communication protocols (e.g., cellular phone, blue tooth, etc.) may need different encoding schemes. FIG. 5 is a block diagram illustrating one example of an encoding mechanism using data from a transmit buffer. Transmit buffer 505 contains data to be transmitted. The data may be placed into the transmit buffer 505 by a CPU (not shown). In this example, a byte 510 is retrieved from the transmit buffer 505 and encoded. The byte 510 is used as an address for the look-up table 515. The look-up table 515 contains codes generated using specific patterns sequences with desired spectral characteristics. For example, when performing 8 bit-to-11 bit encoding, the look-up table 515 may include 256 eleven-bit codes. The code is then retrieved from the look-up table 515 and fed to a n-bit shift register 520 which outputs a serial data stream as transmit data 525. This transmit data is transmitted out of the system.

Figure 6:
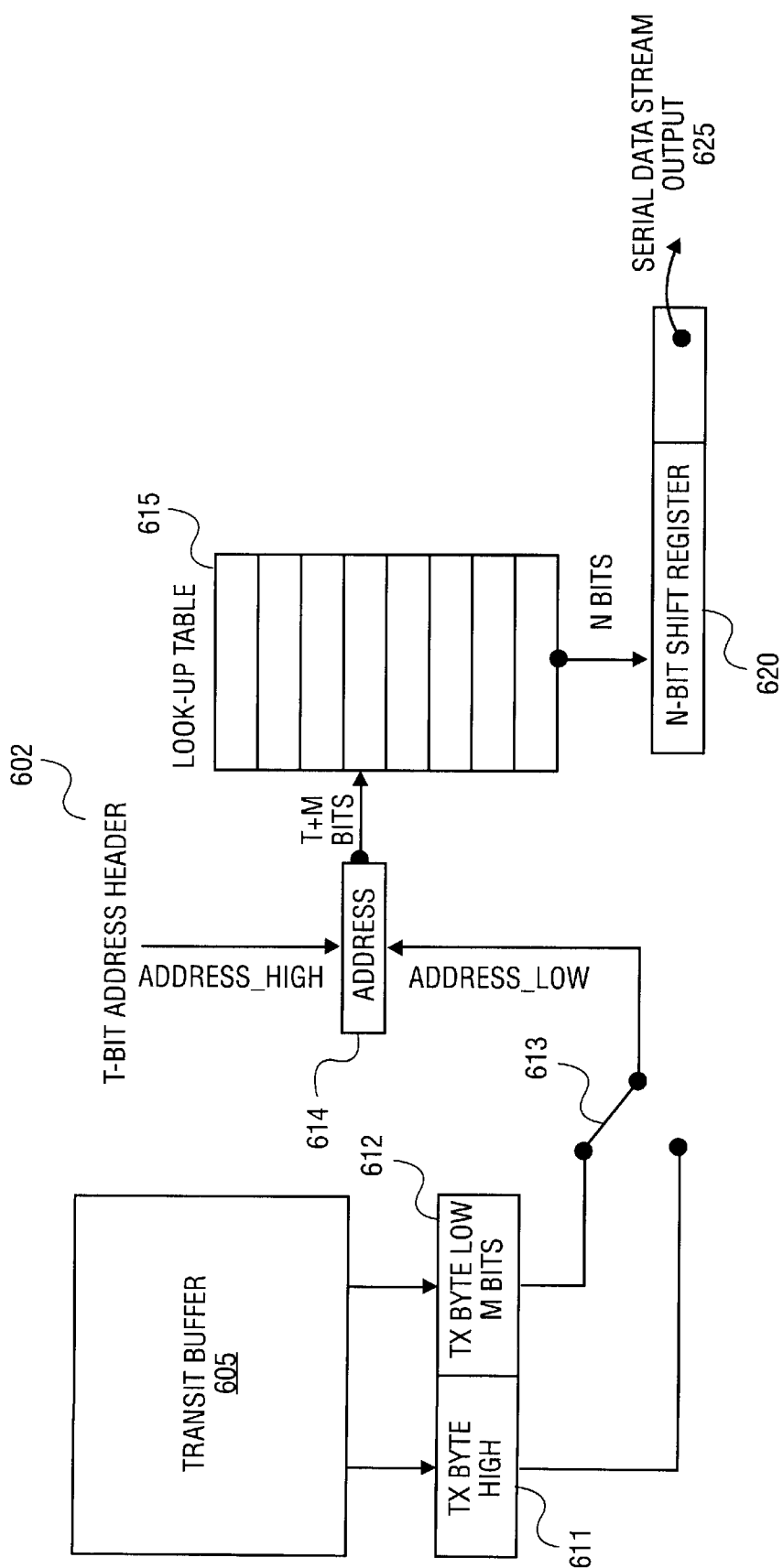
FIG. 6 is a block diagram illustrating one example of an encoding mechanism using a half byte from a transmit buffer.

FIG. 6 is a block diagram illustrating one example of an encoding mechanism using data from a transmit buffer. Transmit buffer 605 contains data to be transmitted. The data may be placed into the transmit buffer 605 by a CPU (not shown). In this example, a block encoding technique is used to encode four bits of data. A data byte is retrieved from the transmit buffer. The lower four bits 612 of the data byte are first encoded, and the higher four bits 611 of the data byte are next encoded using the switching mechanism 613. These four bit groups are used to form the low address bits by an addressing mechanism 614. The lower four bits 612 and the higher four bits 611 are data extracted from the transmit buffer without any conversion.

The address mechanism 614 also receives a T-bit address header 602 based on the wireless protocol currently active. There may be multiple types of encoding schemes used to reduce the energy in different bands if multiple wireless communication devices exist on the platform (e.g., cell phone, blue tooth, etc.). For example, the address header 602 may be one bit long and is used to indicate one encoding scheme when its value is "1" and another encoding scheme when its value is "0".

The address mechanism 614 then forms an address for the look-up table 615. The look-up table 615 contains codes generated using specific patterns sequences with desired spectral characteristics, as described above in connection with FIG. 5. The code is then retrieved from the look-up table 615 and fed to an N-bit shift register 620 which outputs a serial data stream as transmit data 625. This transmit data 625 is transmitted out of the system. Although, the example illustrated in FIG. 6 indicates the lower and higher four bits from the transmit buffer, other data size may also be used. For example, instead of breaking into two half bytes (4 bits), the entire byte may also be used as illustrated in FIG. 5.

Figure 7:
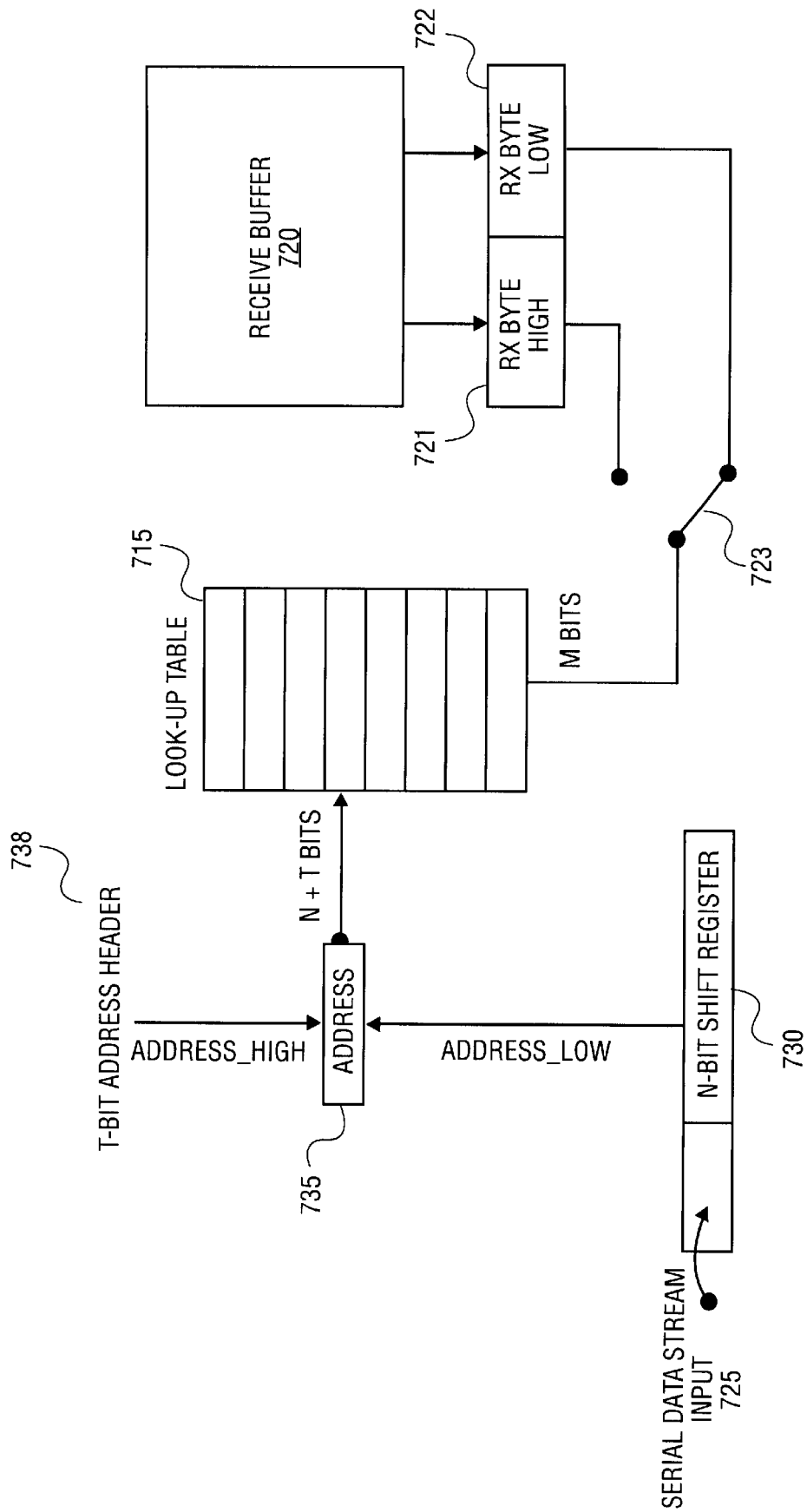
FIG. 7 is a block diagram illustrating one example of an encoding mechanism retrieving a half byte per encoded word.

FIG. 7 is a block diagram illustrating one example of an encoding mechanism using data from a receive buffer. Serial input data stream 725 is received by the N-bit shift register 730. The N-bit shift register 730 forms a low address for the addressing mechanism 735. When there are multiple protocols, a T-bit address header 738 is used to provide a high address for the addressing mechanism 735. The addressing mechanism 735 uses the low address and the high address to form an address for the lookup table 715. The content of the entry in the lookup table 715 pointed to by the address formed by the addressing mechanism 735 is used as data to be stored in the receive buffer 720. In this example, each entry of the lookup table 715 is four bits long, and the switching mechanism 723 is used to indicate whether the entry is the lower four bits 722 or the higher four bits 721. The diagram in FIG. 7 illustrates a reverse operation of the diagram illustrated in FIG. 6.

The operations of the various methods of the present invention may be implemented by a processing unit in a digital processing system, which executes sequences of computer program instructions which are stored in a memory which may be considered to be a machine readable storage media. The memory may be random access memory, read only memory, a persistent storage memory, such as mass storage device or any combination of these devices. Execution of the sequences of instruction causes the processing unit to perform operations according to the present invention. For example, the sequences of instructions may evaluate the FFT frequency spectrum of all n-bits codes from 0 to $2^n$ and then outputs the $2^m$ codes that have the lowest maximum FFT component in the frequency range of interest. The instructions may be loaded into memory of the computer from a storage device or from one or m ore other digital processing systems (e.g. a server computer system) over a network connection. The instructions may be stored concurrently in several storage devices (e.g. DRAM and a hard disk, such as virtual memory). Consequently, the execution of these instructions may be performed directly by the processing unit.

In other cases, the instructions may not be performed directly or they may not be directly executable by the processing unit. Under these circumstances, the executions may be performed by causing the processor to execute an interpreter that interprets the instructions, or by causing the processor to execute instructions which convert the received instructions to instructions which can be directly executed by the processor. In other embodiments, hardwired circuitry may be used in place of or in combination with software instructions to implement the present invention. Thus, the present invention is not limited to any specific combination of hardware circuitry and software, nor to any particular source for the instructions executed by the computer or digital processing system Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method, comprising:
   determining number of bits in a code;
   forming a set of codes given the number of bits in the code;
   determining frequency spectrums of all the codes in the set of codes; and
   selecting a subset of the codes based on spectral properties of the codes in a desired frequency band.

2. The method of claim 1, wherein selecting the subset of the codes based on spectral properties of the codes comprises selecting codes having lowest energy levels in the desired frequency band.

3. The method of claim 1, wherein selecting the subset of the codes based on spectral properties of the codes comprises selecting codes having spectral nulls in the desired frequency band.

4. The method of claim 1, further comprising:
   determining number of bits in an input string to be mapped to a code in the subset of the codes.

5. The method of claim 4, wherein each input string is mapped to a code in the subset of the codes on a one-to-one basis.

6. The method of claim 4, wherein the number of bits in the code is more than the number of bits in the input string.

7. The method of claim 1, wherein the frequency spectrum is determined using Fast Fourier Transform (FFT).

8. A computer readable medium containing executable instructions which, when executed in a processing system, causes the processing system to perform a method comprising:
   determining number of bits in a code;
   forming a set of codes given the number of bits in the code;
   determining frequency spectrums of all the codes in the set of codes; and
   selecting a subset of the codes based on spectral properties of the codes in a desired frequency band.

9. The computer readable medium of claim 8, wherein selecting the subset of the codes based on spectral properties of the codes comprises selecting codes having lowest energy levels in the desired frequency band.

10. The computer readable medium of claim 8, wherein selecting the subset of the codes based on spectral properties of the codes comprises selecting codes having spectral nulls in the desired frequency band.

11. The computer readable medium of claim 8, further comprising:
    determining number of bits in an input string to be mapped to a code in the subset of the codes.

12. The computer readable medium of claim 11, wherein each input string is mapped to a code in the subset of the codes on a one-to-one basis.

13. The computer readable medium of claim 11, wherein the number of bits in the code is more than the number of bits in the input string.

14. The computer readable medium of claim 8, wherein the frequency spectrum is determined using Fast Fourier Transform (FFT).

15. An apparatus, comprising:
    a processor;
    a memory coupled to the processor;
    a lookup table coupled to the memory and the processor, the lookup table including codes having spectral properties in a desired frequency band, wherein each code in the lookup table is mapped to a data string; and a receive buffer coupled with the lookup table, wherein the receive buffer receives a code from the lookup table instead of a corresponding data string to reduce interference in the desired frequency band.

16. The apparatus of claim 15, further comprising:

an addressing mechanism coupled with the lookup table, the addressing mechanism uses the data string to access the corresponding code from the lookup table.

17. The apparatus of claim 15, wherein the spectral properties include having lowest energy levels in the desired frequency band.

18. The apparatus of claim 15, wherein the spectral properties include having spectral nulls in the desired frequency band.

19. An apparatus, comprising:

a processor;

a memory coupled to the processor;

a lookup table coupled to the memory and the processor, the lookup table including codes having spectral properties in a desired frequency band, wherein each code in the lookup table is mapped to a data string; and a transmit buffer coupled with the lookup table, wherein the transmit buffer transmits a code from the lookup table instead of a corresponding data string to reduce interference in the desired frequency band.

20. The apparatus of claim 19, further comprising:

an addressing mechanism coupled with the lookup table, the addressing mechanism uses the data string to access the corresponding code from the lookup table.

21. The apparatus of claim 19, wherein the spectral properties include having lowest energy levels in the desired frequency band.

22. The apparatus of claim 19, wherein the spectral properties include having spectral nulls in the desired frequency band.

23. An apparatus, comprising:

a processor;

a memory coupled to the processor, the memory comprising a first set of instructions that, when executed by the processor, map an input string to a code, the input string having a first a number of bits, the code having a second number of bits, the first number of bits being less than the second number of bits, the code having a low energy spectral property in a desired frequency band.

24. The apparatus of claim 23, further comprising:

a second set of instructions to map the code to the input string.

25. The apparatus of claim 23, wherein every possible input string having the first number of bits is mapped to a different code in a first set of codes having the second number of bits, the first set of codes being a subset of all possible codes.

26. The apparatus of claim 25, wherein each of the codes in the first set of codes has lower energy spectral property in the desired frequency band than codes not in the first set of codes.

* * * * *